United States Patent
Sato

(10) Patent No.: US 8,111,312 B2
(45) Date of Patent: Feb. 7, 2012

(54) SOLID-STATE IMAGING DEVICE, METHOD OF DRIVING THE SAME, AND CAMERA

(75) Inventor: Hiroki Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 348 days.

(21) Appl. No.: 11/680,778

(22) Filed: Mar. 1, 2007

(65) Prior Publication Data

US 2007/0279506 A1 Dec. 6, 2007

(30) Foreign Application Priority Data

Mar. 6, 2006 (JP) ................................ P2006-059857

(51) Int. Cl.
*H04N 5/335* (2011.01)
*H03M 1/12* (2006.01)
*H03M 1/66* (2006.01)

(52) U.S. Cl. ........ 348/302; 348/294; 341/172; 341/155; 341/144

(58) Field of Classification Search .......... 348/294–310; 341/110–172
See application file for complete search history.

(56) References Cited

U.S. PATENT DOCUMENTS

| 5,801,657 | A * | 9/1998 | Fowler et al. ................. | 341/155 |
| 6,222,478 | B1 * | 4/2001 | Bright ........................... | 341/162 |
| 6,323,800 | B1 * | 11/2001 | Chiang ......................... | 341/161 |
| 6,757,018 | B1 * | 6/2004 | Fowler .......................... | 348/301 |
| 6,914,549 | B2 * | 7/2005 | Chen et al. .................... | 341/155 |
| 7,084,803 | B2 * | 8/2006 | Kobayashi et al. ........... | 341/162 |
| 7,319,425 | B2 * | 1/2008 | Fiorenza et al. .............. | 341/172 |
| 7,471,228 | B2 * | 12/2008 | Cho et al. ...................... | 341/162 |
| 2005/0195304 | A1 * | 9/2005 | Nitta et al. .................... | 348/308 |
| 2006/0012507 | A1 * | 1/2006 | Nitta et al. .................... | 341/156 |
| 2008/0136948 | A1 * | 6/2008 | Muramatsu ................... | 348/294 |

FOREIGN PATENT DOCUMENTS

| JP | 2002-34037 | 1/2002 |
| JP | 2003-198372 | 7/2003 |

* cited by examiner

*Primary Examiner* — Sinh Tran
*Assistant Examiner* — Mark Monk
(74) *Attorney, Agent, or Firm* — SNR Denton US LLP

(57) ABSTRACT

A solid-state imaging device includes: a plurality of pixels which are arranged in a matrix; a sequential scanning device that selects each row of pixels; and an analog-to-digital conversion unit having a first analog-to-digital converter that is connected to a vertical signal line to which a pixel signal is supplied from the pixel and performs a first bit-length analog-to-digital conversion on an output signal from the vertical signal line or a pixel output signal obtained by sampling the output signal, and a second analog-to-digital converter that, when the first analog-to-digital converter completes the conversion operation, subtracts an analog signal corresponding to the first bit-length from the pixel output signal and then performs a second bit-length analog-to-digital conversion.

13 Claims, 12 Drawing Sheets

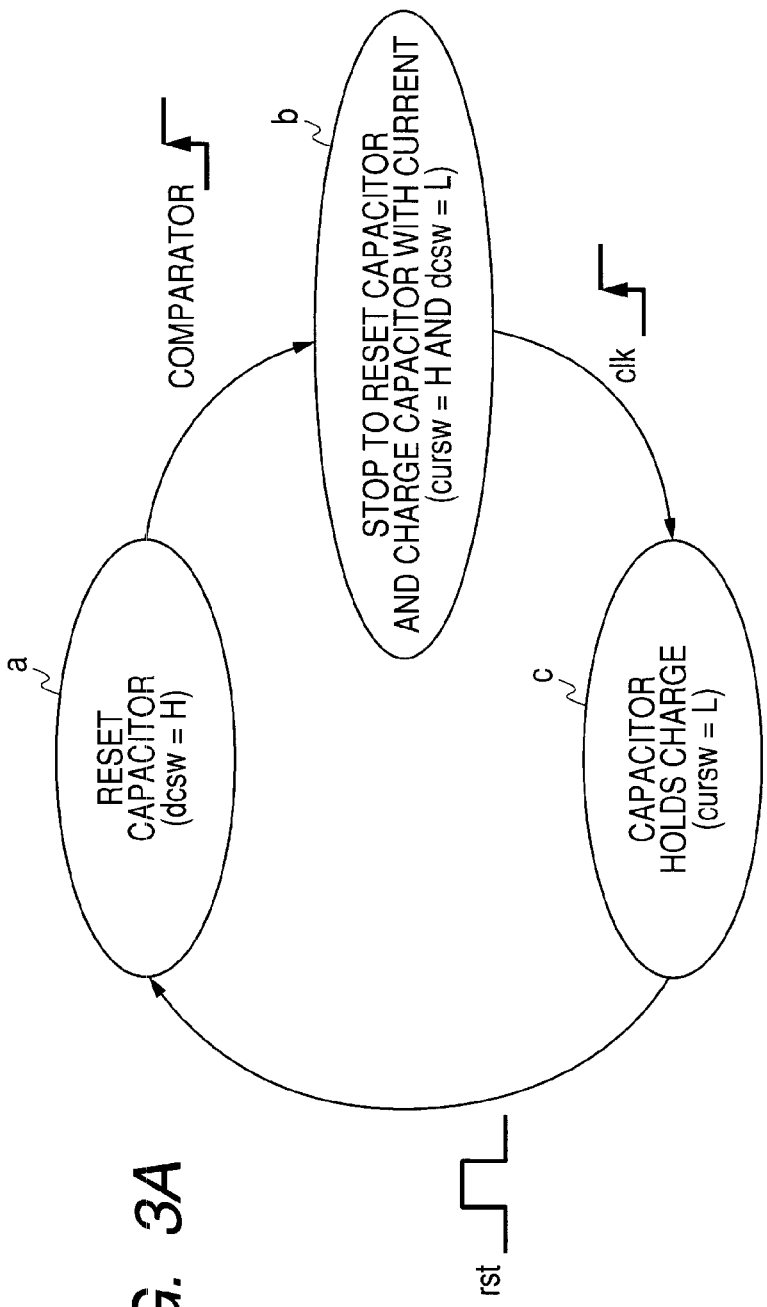
FIG. 3A
FIG. 3B
FIG. 3C

_US 8,111,312 B2_

SOLID-STATE IMAGING DEVICE, METHOD OF DRIVING THE SAME, AND CAMERA

CROSS REFERENCES TO RELATED APPLICATIONS

The present invention contains subject matter related to Japanese Patent Application JP 2006-059857 filed in the Japanese Patent Office on Mar. 6, 2006, the entire contents of which being incorporated herein by reference.

BACKGROUND OF THE INVENTION

1. Field of the Invention

The invention relates to a solid-state imaging device including column-parallel analog-to-digital converters provided to outputs of a plurality of vertical signal lines and capable of moderating device accuracy and reducing a conversion time, to a method of driving the solid-state imaging device, and to a camera.

2. Description of the Related Art

As shown in FIG. 8, a known solid-state imaging device 400 including a column-parallel analog-to-digital converter generally uses a counter-ramp-type analog-to-digital converter using a single slope.

The operation of the analog-to-digital converter shown in FIG. 8 will be described with reference to a timing chart of FIG. 9. In a pixel array 410, a plurality of pixels 411-11 to 411-nm which convert external light into an electrical signal by photoelectric conversion are arranged in a matrix. A certain row in the pixel array 410 is selected by a vertical selection circuit 401. A pixel signal (hereinafter, referred to as a 'pixel output signal') is output from the pixels 411-11 to 411-nm in the selected row, that is, from vertical signal lines vsl1 to vslm extended in the column direction of the pixel array 410.

Each of the vertical signal lines vsl1 to vslm is connected to one of input terminals (positive terminal side or a non-inversion input terminal) of a comparator 431 provided at every column. A signal nslope output from an additionally provided digital-to-analog converter 420 to which an analog output (voltage) is supplied in accordance with a clock signal is connected to the other input terminal (negative terminal side or an inversion input terminal) of the comparator 431.

That is, if the pixel output signal output from one of the vertical signal lines vsl1 to vslm is smaller than the signal nslope output from the digital-to-analog converter 420, a signal ncompout output from the comparator 431 becomes a low level. Meanwhile, if the pixel output signal output from one of the vertical signal lines vsl1 to vslm is larger than the signal nslope output from the digital-to-analog converter 420, the signal ncompout output from the comparator 431 becomes a high level. The signal ncompout output from the comparator 431 is input to an n-bit counter 432 so as to increase or decrease a count value in accordance with a clock signal clk (FIG. 8 shows an example in which a value decreases one by one in accordance with the clock).

The count value becomes an initial value $i_{init}$ by a reset signal rst. The count value is stopped to be increased or decreased when the signal ncompout output from the comparator 431 becomes a high level and n-bit counter 432 holds the count value at that time (value i in FIG. 9). The count value is output as an n-bit output data [n−1:0] of the n-bit counter 432. That is, the count value is composed and sequentially output with outputs from other counters provided at different columns.

Further, as shown in FIG. 10, another solid-state imaging device 500 including a column-parallel analog-to-digital converters 530-1 (to 530-m) isprovided. It is an example that so-called successive approximation analog-to-digital converter 530-1 (to 530-m) is used in the solid-state imaging device 500.

First, the structure of the column-parallel analog-to-digital converter 530-1 (to 530-m) shown in FIG. 10 will be described. Next, the operation of the analog-to-digital conversion will be described with reference to a timing chart of FIG. 11.

As the same as shown in FIG. 8, a vertical signal lines vsl1 (to vslm) is connected to a positive terminal side of a comparator 531.

A signal ncompout output from the comparator 531 is input to a latch-logic circuit 532. The latch-logic circuit 532 outputs a plurality of control signals of a plurality of switches 534-1 to 534-n and 535-1 to 535-n connected to polar plates of a plurality of capacitors C(533-1), C/2 (533-2), ..., and $C/2^n$ (533-n) which have capacitances. The switches 534-1 to 534-n and 535-1 to 535-n connect the polar plates to a vref2 terminal or a ground. The other polar plates of the capacitors C(533-1), C/2(533-2), ..., and $C/2^n$ (533-n) are connected to a negative terminal side vcomp of the comparator 531. Further, the negative terminal side vcomp of the comparator 531 and the vertical signal lines vsl1 to vslm are connected to the vref1 terminal through the switches 536 to 537 which use the reset signal rst as a control signal.

Next, the operation of the successive approximation analog-to-digital converter 530-1 (to 530-m) will be described.

When the reset signal rst becomes a high level, the negative terminal side vcomp of the comparator 531 and the vertical signal line vs1 have a voltage which is at the same level as the voltage vref1. Further, a voltage at polar plate opposite to the comparator 531 of all the capacitors C(533-1), C/2(533-2), ..., and $C/2^n$ (533-n) is connected to the ground. Therefore, the reset operation is performed.

Next, when a signal is read out from the pixels 511-11 to 511-nm, a level of the vertical signal line vsl1 (to vslm) becomes a level of the voltage in accordance with the read out signal. At this time, when the clock signal clk is at a high level, the latch-logic circuit 532 outputs a control signal of the switch 534-1 such that the voltage vref2 is applied to the polar plate of the capacitor C(533-1) in the direction opposite to the comparator 531.

Therefore, the voltage of the negative terminal side vcomp of the comparator 531 becomes a voltage vref1+vref2 so as to perform a comparison operation of an (n−1)-th bit comparator 531. At this time, in the embodiment of FIG. 10, since a level of signal vsl is higher than a voltage level of the negative terminal side vcomp, the comparator 531 outputs a signal at a high level (time t6). When the clock signal clk is at a low level, the value of the clock signal clk is latched as data[n−1] (time t7).

Next, when the clock signal clk is at a high level (time t8), the latch-logic circuit 532 outputs a control signal of the switches 534-2 and 535-2 such that the voltage vref2 is applied to the polar plate of the capacitor C/2 (533-2) in the direction opposite to the comparator 531. Then, the voltage of the negative terminal side vcomp of the comparator 531 becomes a voltage vref1+vref2/2. Therefore, the comparison operation of an (n−2)-th bit comparator 531 is performed.

At this time, in the embodiment of FIG. 10, a voltage level of the negative terminal side vcomp is set to be higher than a level of the signal vsl and the control signals of the switches 534-2 and 535-2 are output from the latch-logic circuit 532. Therefore, the voltage of the negative terminal side vcomp becomes a voltage vref1+vref2/2. Therefore, a comparison operation of an (n−2)-th bit comparator 531 is performed.

At this time, in the embodiment of FIG. 10, since the voltage level of the vertical signal line vsl1 is lower than the voltage level of the negative terminal side vcomp, the comparator 531 outputs a signal at a low level. When the clock signal clk is at a low level, the value of the output signal is latched as data [n−2] (time t9). When the clock signal clk is at a high level, the polar plate of the capacitor C/2 in the direction opposite to the comparator 531 is connected to the ground.

Hereinafter, by repeating the same operation until the capacitor $C/2^n$ (533-$n$), a value of n-bit data data[n−1:0] is determined and sent through a data line. A similar technology is disclosed in JP-A-2002-34037.

SUMMARY OF THE INVENTION

However, the counter-ramp-type analog-to-digital converter using the single slope shown in FIG. 8 has a problem that the conversion time should be increased or a clock frequency should be increased in order to improve the accuracy of the analog-to-digital conversion. For example, the number of clocks which is necessary to perform analog-to-digital conversion using n bits is $2^n-1$ cycle. Further, if the number of bits is expanded to (n+1) bits, $2^{n+1}-1$ cycle, that is, approximately to times as many as the number of clocks are necessary. Therefore, in order to implement the corresponding number of clocks, conversion time should be about two times longer or the clock frequency should be about two times higher. When the conversion time is about two times longer, it is difficult to implement a high speed operation such as the high frame rate of the solid-state imaging device or high pixilation. When the number of the clock frequencies become two times higher, it may cause to increase the power consumption and bring on high accuracy of an element.

Meanwhile, the successive approximation analog-to-digital converter shown in FIG. 10 does not have a problem that the conversion time increases as the counter-ramp-type analog-to-digital converter when increasing the accuracy of the analog-to-digital conversion. However, since the plurality of capacitors are used in the successive approximation analog-to-digital converter, the processing accuracy affects the accuracy of the analog-to-digital conversion. Therefore, a problem occurs that the layout of the capacitor becomes large and the cost increases.

It is desirable to provide a solid-state imaging device that includes a column-parallel analog-to-digital converter which may solve the problems such as increasing of conversion time at the counter-ramp-type analog-to-digital converter or the increase of the layout area at the successive approximation analog-to-digital converter so as to moderate element accuracy and reduce the conversion time, and a method of driving the solid-state imaging device, and a camera.

According to an embodiment of the invention, there is provided a solid-state imaging device which includes: a plurality of pixels which are arranged in a matrix; a sequential scanning device that selects each row of pixels; and an analog-to-digital conversion unit having a first analog-to-digital converter that is connected to a vertical signal line to which a pixel signal is supplied from the pixel and performs a first bit-length analog-to-digital conversion on an output signal from the vertical signal line or a pixel output signal obtained by sampling the output signal, and a second analog-to-digital converter that, when the first analog-to-digital converter completes the conversion operation, subtracts an analog signal corresponding to the first bit-length from the pixel output signal and then performs a second bit-length analog-to-digital conversion.

According to another embodiment of the invention, there is provided a solid-state imaging device which includes: a plurality of pixels which are arranged in a matrix; a sequential scanning device that selects each row of pixels; and a plurality of analog-to-digital converters that are arranged in column-parallel and convert an analog signal acquired from the pixel into an n-bit digital signal (where, n is an arbitrary positive integral number). In the solid-state imaging device, the plurality of analog-to-digital converters are divided into an uppermost m-bit (where, m is an arbitrary positive integral number smaller than n) analog-to-digital converter and a lowermost (n−m)-bit analog-to-digital converter. When analog-to-digital conversion is performed on an output signal from the pixels or a pixel output signal obtained by sampling the output signal, the analog-to-digital conversion is initially performed on the uppermost m bits, a signal corresponding to the uppermost m bits is subtracted from the pixel output signal, and the analog-to-digital conversion is performed on the lowermost (n−m) bits.

According to still another embodiment of the invention, there is provided a solid-state imaging device which includes: a plurality of pixels which are arranged in a matrix; a sequential scanning device that selects each row of pixels; and a plurality of analog-to-digital converters that are arranged in column-parallel and convert an analog signal acquired from the pixel into an n-bit digital signal (where, n is an arbitrary positive integral number). The plurality of analog-to-digital converters are divided into an uppermost m-bit analog-to-digital converter and a lowermost (n−m)-bit analog-to-digital converter. Uppermost m-bit analog-to-digital conversion is performed by a comparator and a clock counter which are arranged in column-parallel. A pixel output signal is input to one input terminal of the comparator and a reference signal output from a digital-to-analog converter is input to the other input terminal of the comparator. The reference signal is changed in accordance with a clock input from a predetermined initial value. When a magnitude relationship between the pixel output signal and the reference signal input to the comparator is reversed, an output signal from the comparator changes so as to count the number of clocks according to the pixel output signal and acquire an uppermost m-bit analog-to-digital conversion value of the pixel output signal by acquiring a digital value according the number of clocks. Further, when lowermost (n−m)-bit analog-to-digital conversion is performed on the pixel output signal, electrical charge is stored in a capacitor provided for every column in a period from a time where the output signal of the comparator changes to a time where a next cycle of the clock starts so as to sample a signal corresponding to the lowermost (n−m) bits of the pixel output signal. Analog-to-digital conversion is performed on a voltage of the sampled signal by an additionally provided lowermost (n−m)-bit analog-to-digital converter. In this way, analog-to-digital conversion is performed on the pixel output signal by n bits.

In the column-parallel analog-to-digital conversion at the solid-state imaging device, it is possible to reduce a conversion time to approximately $2^m$ order in the case of the uppermost m bits and to approximately $2^{n-m}$ order in the case of the lowermost (n−m) bits by separately performing the uppermost m-bit analog-to-digital conversion from the lowermost (n−m)-bit analog-to-digital conversion. Therefore, it is also possible to moderate the element accuracy.

Further, in the column-parallel analog-to-digital conversion at the solid-state imaging device, the counter-ramp-type analog-to-digital conversion requires an area smaller than a successive approximation analog-to-digital conversion but conversion time thereof is longer than the successive approximation analog-to-digital conversion. However, it is possible to reduce the conversion time by performing sampling by charging a voltage corresponding to the lowermost (n−m) bits in the capacitor on the counter-ramp-type analog-to-digital conversion and separately performing the lowermost (n−m)-bit analog-to-digital conversion. Further, it is possible to moderate the element accuracy in the fact that the sampled voltage has a gain.

BRIEF DESCRIPTION OF THE DRAWINGS

FIGS. 3A to 3C are diagrams illustrating the function of a state machine of the analog-to-digital converter shown in FIG. 2;

DESCRIPTION OF THE PREFERRED EMBODIMENTS

Figure 1:
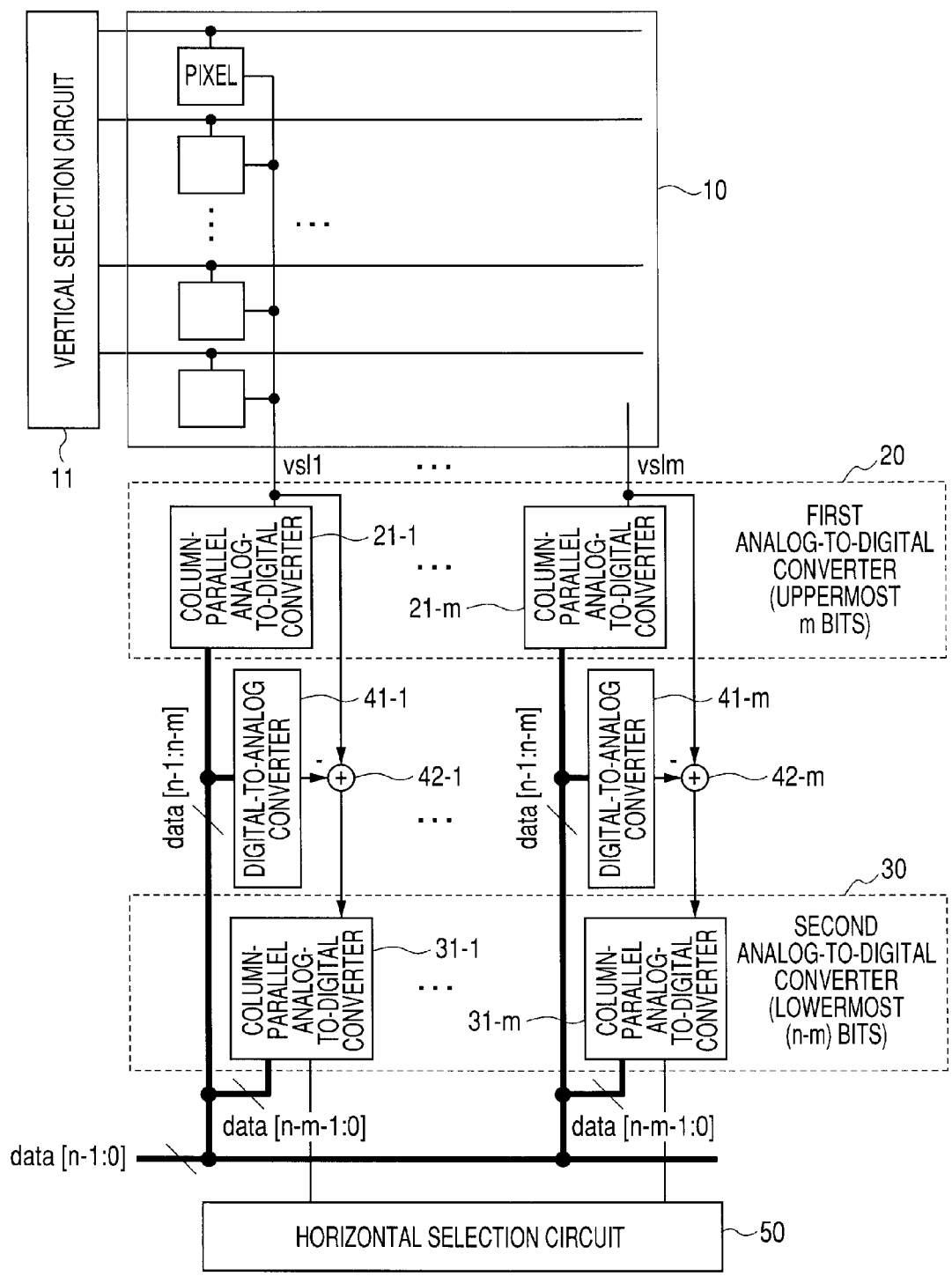
FIG. 1 is a diagram illustrating the block structure of a solid-state imaging device including an analog-to-digital converter.

FIG. 1 is a diagram illustrating the block structure of a solid-state imaging device 100 including a column-parallel analog-to-digital converter according to an embodiment of the invention.

The solid-state imaging device 100 includes a pixel unit 10 which will be described later, a first uppermost m-bit analog-to-digital converter 20, a second lowermost (n−m)-bit analog-to-digital converter 30 (where, m and n are arbitrary positive integers and n is larger than m), a timing signal generator (not shown), a vertical selection circuit 11, and a horizontal selection circuit 50.

The timing signal generator (not shown) receives a vertical synchronization signal, a horizontal synchronization signal, a sensor driving clock, and a sensor reset signal from the external of a sensor of the solid-state imaging device 100. The timing signal generator generates a timing signal so as to drive the vertical selection circuit 11, the horizontal selection circuit 50, the column-parallel AD converters (first and second analog-to-digital converters 20 and 30) using the above-described input signals.

The vertical selection circuit 11 receives row information from the timing signal generator, selects only a row designated in the row information, and sequentially selects a horizontal line from a first row.

A plurality of pixels are arranged in an n by m matrix in the pixel unit 10 and each include a PD (photo diode), a transfer gate MOS transistor, an FD (floating diffusion), a reset MOS transistor, or an amplification MOS transistor. An output of the amplification MOS transistor is input to the vertical signal line and a pixel (output) signal detected by the PD is output to the column-parallel AD converter through the vertical signal line.

The column-parallel AD converter includes the first analog-to-digital converter 20, digital-to-analog converters 41-1 to 41-m, adders 42-1 to 42-m, and the second analog-to-digital converter 30.

The first analog-to-digital converter 20 includes column-parallel analog-to-digital converters 21-1 to 21-m and receives the pixel output signal from the vertical signal lines vsl1 to vslm.

Further, the second analog-to-digital converter 30 includes column-parallel analog-to-digital converters 31-1 to 31-m which become a pair with the column-parallel analog-to-digital converters 21-1 to 21-m of the first analog-to-digital converter 20.

Each of input terminals of adders 42-1 to 42-m is connected to each of output terminals of the digital-to-analog converters 42-1 to 42-m and each of the vertical signal lines vsl1 to vslm. Further, each of output terminals of adders 42-1 to 42-m is connected to each of the column-parallel analog-to-digital converters 31-1 to 31-m included in the second analog-to-digital converter 30.

Further, output terminals of the first analog-to-digital converters 21-1 to 21-m and the second analog-to-digital converters 31-1 to 31-m are connected to a line of data[n-1:0].

Hereinafter, the column-parallel AD converters (the first analog-to-digital converters 21-1 to 21-m and the second analog-to-digital converters 31-1 to 31-m) to be described are connected to each of the vertical lines but the invention is not limited to the solid-state imaging device having the structure in which the column-parallel analog-to-digital converters are connected to all the vertical signal lines.

For example, it is possible that one parallel AD converter is provided for every two or three columns, switching between columns corresponding to each parallel AD converter is performed at a predetermined timing such that signals of some pixels are input to the corresponding parallel AD converter, and the corresponding parallel AD converter converts the signals into digital signals.

The pixel signal supplied from the vertical signal lines vsl1 to vslm is input to the first analog-to-digital converter 20. And then, an analog signal of the pixel signal output from the pixel unit 10 is converted into a digital signal through the second analog-to-digital converter 30.

The analog-to-digital converter includes two or more analog-to-digital converters. The first analog-to-digital converter 20 at a first stage performs analog-to-digital conversion on the predetermined uppermost bits. Next, the digital-to-analog converter 41-1 (to 41-m) performs DA (digital-to-analog) conversion on the uppermost bits and the adder 42-1 (to 42-m) acquires the difference from the input pixel signals. And then, the second analog-to-digital converter 30 at a next stage performs the second analog-to-digital conversion on the difference. That is, following operations are repeated.

The above described first and second analog-to-digital converters 20 and 30 may perform the analog-to-digital conversion using a plurality of methods. In this embodiment of the invention, the conversion method is not limited.

The horizontal selection circuit 50 is connected to the column-parallel analog-to-digital converters (first analog-to-digital converter 20 and second analog-to-digital converter 30) arranged in the column direction. The horizontal selection circuit 50 sequentially selects the column-parallel analog-to-digital converters at a predetermined timing in synchronization with the clock signal output from the timing signal generator and derives digital-converted data of the pixel output signals at each column.

Next, an analog-to-digital converter having two stages will be described as one embodiment of the solid-state imaging device 100 shown in FIG. 1. The pixel output signal output from the pixel unit 10 is input to the n-bit analog-to-digital converters 20 and 30 which are arranged in column parallel through the vertical signal line. This n-bit analog-to-digital converter includes an uppermost m-bit analog-to-digital converter and a lowermost (n−m)-bit analog-to-digital converter.

The structure of the first uppermost m-bit analog-to-digital converter 20 and the second lowermost (n−m)-bit analog-to-digital converter 30 are not limited. For example, the analog-to-digital converter may be applied to an entire column-parallel analog-to-digital converter, a column-series-parallel analog-to-digital converter, a counter-ramp-type analog-to-digital converter, a successive approximation counter-ramp-type analog-to-digital converter, or the combination thereof.

Further, the second analog-to-digital converter 30 may perform the analog-to-digital conversion on the lowermost (n−m) bits of the pixel output signal using a plurality of methods. The lowermost (n−m)-bit data of the pixel output signal may be acquired by converting the digital signal acquired by the first uppermost m-bit analog-to-digital converter 20 into an analog signal, performing subtraction between the pixel input signal and the converted analog signal, and performing the analog-to-digital conversion on the subtracted analog signal by the additionally provided second lowermost (n−m)-bit analog-to-digital converter 30.

As a result, it is possible to acquire the digital data in which the (analog) pixel output signal is analog-to-digital converted into n bits.

Thereafter, the digital data output from the first uppermost m bit analog-to-digital converter 20 and the second lowermost (n−m)-bit analog-to-digital converter 30 are composed so as to be output as n-bit digital image data.

Here, the analog-to-digital converter having the two stages is exemplified but the invention is not limited thereto. The invention may be applied to an analog-to-digital converter having three stages, four stages, . . . , or n-stages.

When the above described solid-state imaging device using the analog-to-digital converter has, for example, two stages, the second lowermost (n−m)-bit analog-to-digital conversion may be performed on signals under a predetermined level using the pixel output signal acquired by the first uppermost m bit analog-to-digital conversion. Therefore, a high-accuracy analog-to-digital conversion is performed with respect to the pixel output signal of low illumination, which has low photo-shot-noise and a low-accuracy analog-to-digital conversion is performed with respect to the pixel output signal of high illumination, which has high photo-shot-noises. Accordingly, it is possible to implement a solid-state imaging device which uses lower power consumption.

Further, although the counter-ramp-type analog-to-digital converter in which the area thereof is smaller than the successive approximation analog-to-digital converter but conversion time is longer than the successive approximation analog-to-digital converter is used, it is possible to implement the solid-state imaging device in which the conversion time is largely reduced in the column-parallel analog-to-digital converter of the solid-state imaging device.

As an applicable example of the analog-to-digital converter having two stages, for example, the uppermost m bits are analog-to-digital converted so as to perform the analog-to-digital conversion for monitor when capturing an image. Further, if a high accuracy conversion is necessary, for example, in a case of capturing a real image, the lowermost (n−m) bits are analog-to-digital converted. Therefore, it is possible to implement a solid-state imaging device which is capable of performing high speed monitor and using lower power consumption.

Next, an example of the structure of the solid-state imaging device 200 including the analog-to-digital converters 220-1 to 220-m shown in FIG. 2 will be described.

Figure 2:
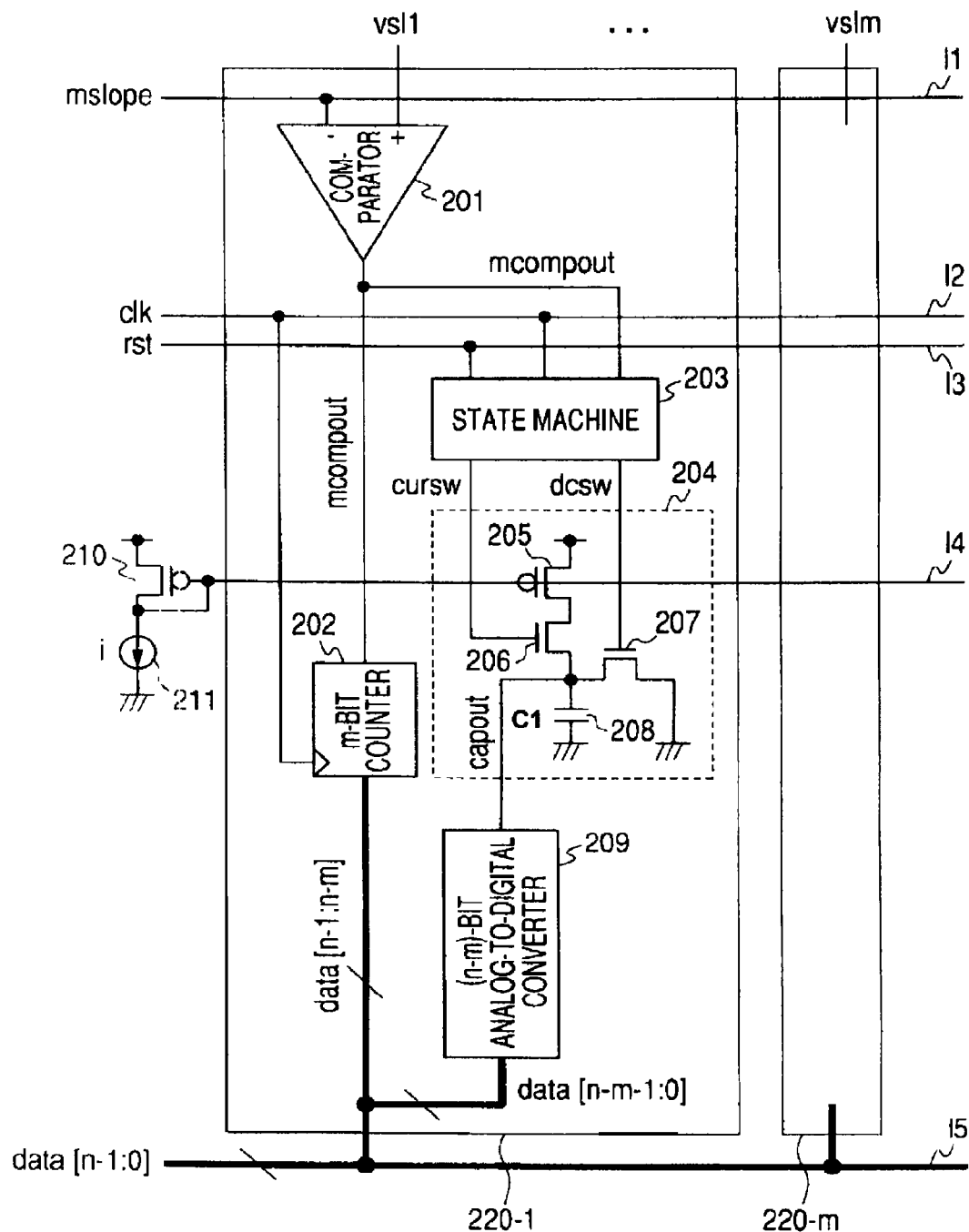
FIG. 2 is a diagram illustrating the block structure of the analog-to-digital converter shown in FIG. 1.

As shown in FIG. 2, the analog-to-digital converter includes two analog-to-digital converters 220-1 and 220-m, that is, uppermost and lowermost analog-to-digital converters, which convert the analog pixel output signal acquired from the vertical signal lines vsl1 to vslm repeatedly arranged in the vertical direction from the pixel (array) unit into a digital signal (data).

Further, in the analog-to-digital converter 220-1 (to 220-m) included in the uppermost and lowermost analog-to-digital converters, the output of the vertical signal lines vsl1 to vslm is input to the uppermost m-bit analog-to-digital converter. Thereafter, a difference between a DA converted value and the input pixel is calculated, and an output of the uppermost m-bit analog-to-digital converter is input to the lowermost (n−m)-bit analog-to-digital converter. And then, the lowermost analog-to-digital conversion operation is performed. As a result of the conversion, a pixel digital data (signal) is output.

Furthermore, in particular, the counter-ramp-type analog-to-digital converter may be applied to the uppermost m-bit analog-to-digital converter. Further, the converting method of the lowermost (n−m)-bit analog-to-digital converter is not limited thereto.

The uppermost m bits of the analog-to-digital converter 220-1 (to 220-m) includes a comparator 201 and an m-bit counter 202. Further, the lowermost (n−m) bits of the analog-to-digital converter 220-1 (to 220-m) includes a state machine 203 which generates an analog signal corresponding to the lowermost (n−m) bits, a subtraction unit having, for example, a lowermost analog signal voltage generator 204, and an (n−m)-bit analog-to-digital converter 209.

In the uppermost m-bit analog-to-digital converter, the comparator 201 has an inversion input terminal connected to a line 11 so as to receive the reference signal mslope, a non-inversion imputer terminal connected to the vertical signal line vsl1 (to vslm), and an output terminal connected to an input terminal of the m-bit counter 202. A clock signal clk for causing to perform a count operation or a reset operation is supplied to the m-bit counter 202. Further, the output terminal of the comparator 201 is connected to an input terminal of the state machine 203 included as a part of the lowermost (n−m)-bit analog-to-digital converter. The output terminal of the m-bit counter 202 is connected to a data[n−1:0] line 15 so as to output digital data corresponding to uppermost (n−1) to (n−m) bits.

In the lowermost (n−m)-bit analog-to-digital converter, the input terminal of the state machine 203 is connected to a line 12, a line 13, and the output terminal of the comparator 201, respectively, so as to receive the clock clk, the reset signal rst, and output of the comparator 201.

The state machine 203 has a current switch cursw connected to a gate of an N-channel FET 206 and a direct current switch dcsw connected to a gate of an N-channel FET 207 for controlling discharge.

A P-channel FET 205 has a source connected to a reference potential (power supply), a gate connected to a line 14 and a gate and a drain of a P-channel FET 210, and a drain connected to the drain of the N-channel FET 206.

The P-channel FET 210 has a source connected to a reference potential (power supply), and a gate and a drain connected to one terminal of a constant current source 211. The other terminal of the constant current source 211 is connected to the ground.

The source of the N-channel FET 206 is connected to one terminal of a capacitor C1 (208) and to the drain of the N-channel FET 207. The source of the N-channel FET 207 is connected to the ground. The one terminal of the capacitor C1 is connected to an input terminal of the (n−m)-bit analog-to-digital converter 209 and the other terminal of the capacitor C1 is connected to the ground.

An output terminal of the lowermost (n−m)-bit analog-to-digital converter 209 is connected to the data[n−1:0] line 15 so as to output data of the lowermost bit data data[n−m:0].

Next, the operation of the state machine 203 used for the lowermost (n−m)-bit analog-to-digital converter will be described with reference to FIGS. 3A to 3C.

As shown in FIG. 3A, when the reset signal rst is supplied to the state machine 203, a level of the direct switch dcsw changes to a high level, electrical charge charged in the capacitor C1 (208) is discharged, and the m-bit counter 202 is reset. Thereafter, a counting operation is started in synchronization with the clock clk, the conversion operation is performed on the uppermost m bits of a decreasing counter, and a voltage of the reference signal mslope is linearly attenuated from a predetermined voltage in accordance with the clock.

The comparator 201 compares the voltage of the reference signal mslope and the voltage of the vertical signal line vsl. If the voltage of the reference signal mslope is lower than the voltage of the vertical signal line vsl, the operation of the counter stops. If the level of the direct switch dcsw of the state machine 203 becomes a low level, the capacitor C1 (208) stops to discharge. At the same time, since a level of the current switch cursw becomes a high level, the current i the same as that applied by the constant current source 211 is charged in the capacitor C1 (208).

Next, when the next clock (clock clk at time t6) rises, the level of the current switch cursw becomes a low level and the N-channel FET 206 is turned off so as to hold the electrical charge charged in the capacitor C1 (208). This electrical charge is held in the capacitor C1 (208) until the next reset signal rst is input. The above-described operations of the state machine 203 are shown in FIGS. 3B and 3C.

Next, the operation of the analog-to-digital converter 220-1 (to 220-$m$) shown in FIG. 2 will be described with reference to a timing chart of FIG. 4.

Figure 4:
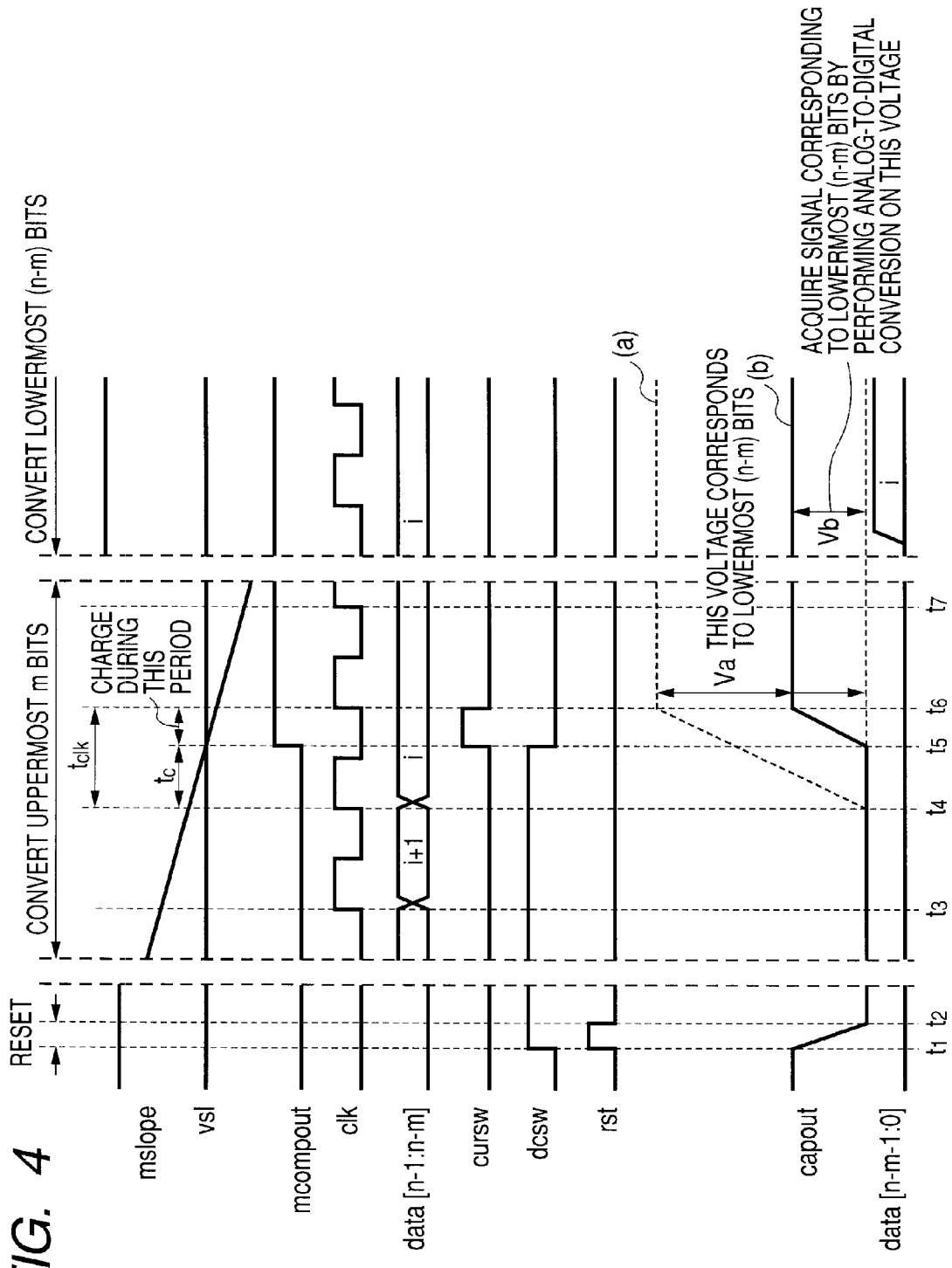
FIG. 4 is a timing chart illustrating the operation of the analog-to-digital converter shown in FIG. 2.

In the timing chart of FIG. 4, the reset signal rst is supplied to the state machine 203 and the m-bit counter 202 at time t1 so as to perform the reset operation. Further, a level of a signal output from the direct current switch dcsw of the state machine 203 is kept at a high level from time t1 to time t5. When a signal at the high level output from the direct current switch dcsw is applied to the gate of the N-channel FET 207, the N-channel FET 207 is turned on. Therefore, the electrical charge of the capacitor C1 (208) is discharged and the electrical potential thereof is kept until time t5.

When the reset signal rst falls down at time t2, the m-bit counter 202 starts the counting operation and the reference signal mslope linearly decreases according to the clock clk. The reference signal mslope input to the inversion terminal of the comparator 201 is compared with the pixel output signal (pixel signal output from the vertical signal line vsl1) input to the non-inversion terminal. If the level of the signal mslope is lower than the level of the pixel signal output from the vertical signal line vsl1, a pulse mcompout at a high level is output from the output terminal of the comparator 201 (time t5) and the level of the pulse mcompout is kept at a high level until the next reset signal rst is supplied.

The m-bit counter 202 ends the operation at time t4. The m-bit counter 202 performs up and down counting but other counting methods may be used.

Thereafter, a count value is converted such that the data[n−1:n−m] is output to the data line 15 as the uppermost m-bit binary data.

Meanwhile, a level of the direct current switch dcsw of the state machine 203 changes from the high level to the low level at time t5 when the levels of the reference signal mslope and the pixel output signal output from the vertical signal line vsl1 are inverted (crossed) so as to turn off the N-channel FET 207. As a result, the capacitor C1 (208) stops discharge.

At time t5, the level of the current switch cursw changes from a low level to a high level. The current switch cursw holds the high level until time t6 where the clock clk rises and the level of the current switch cursw changes to the low level.

That is, during the period from time t5 to time t6 where a next clock clk rises, the current i is charged into the capacitor C1 (208) through the P-channel FET 205 and the N-channel FET 206 (see FIG. 4). Therefore, an analog signal is generated so as to perform a tentative lowermost (n−m)-bit conversion.

Since a current value to be supplied to the capacitor C1 (208) is the same as the current i generated at the constant current source 211 by a current mirror circuit which includes the P-channel FET 210 and the P-channel FET 205, it is possible to set the current value i of the constant current source 211 to a desired value and to arbitrarily set the voltage value stored and acquired during the period from time t5 to time t6. Further, it is possible to latch the gain by the voltage sampled at the capacitor C1 (208). Accordingly, it is possible to moderate the element accuracy.

Here, since the counting operation of the uppermost m-bit counter 202 is performed in accordance with the clock clk, one LSB of the uppermost m bits corresponds to a cycle of one clock clk. The lowermost (n−m) bits indicate electrical charge amount charged in the capacitor C1 (208) during a period tc between time t4 and time t5. The comparator 201 may compare the input signals mslope and vsl at time t5 where the levels of the both signals are inverted. That is, the comparator 201 may compare the input signals mslope and vsl since time t5.

Accordingly, a voltage value Vb obtained by charging the current to the capacitor C1 (208) may be actually measured during a period where the clock cycle tc is subtracted from one clock cycle tclk. If the measured voltage Vb is subtracted from the voltage (voltage Va+Vb of FIG. 4) generated on the basis that the current is charged during a period of one clock tclk (period from time t4 to time t6), the analog signal Va corresponding to the real lowermost (n−m) bits may be obtained.

In particular, the lowermost (n−m)-bit analog-to-digital converter converts the analog signal Vb generated during a period of one clock $t_{clk}$-$t_c$ into a digital signal. Therefore, data (corresponding to Va) in which a digital value corresponding to the analog signal capout (Vb) is subtracted from digital data corresponding to (n–m)-bit full scale (Va+Vb) is acquired.

After the (n–m)-bit analog-to-digital converter 209 performs the lowermost (n–m)-bit analog-to-digital conversion, image data of data[n–m-1:0] is output to the line 15 of the data[n–1:0].

The lowermost (n–m)-bit analog-to-digital converter 209 may use a plurality of conversion methods, such as, a parallel method, a counter-ramp method, or a successive approximation method.

After the uppermost m-bit data is composed with the lowermost (n–m)-bit data, the horizontal selection circuit sequentially selects the n-bit analog-to-digital converters 220-1 to 220-m connected to the above-described vertical signal lines vsl1 to vslm so as to derive digital data.

As described above, when performing the conversion operation shown in the timing chart of FIG. 4, the conversion time which is necessary to perform the uppermost (n–m)-bit analog-to-digital conversion become a $2^{m-1}$ cycle. For example, even when the lowermost (n–m)-bit analog-to-digital conversion of the next stage is performed at $2^{n-m}-1$ cycle, it is possible to largely reduce the conversion time as compared with the analog-to-digital converter 430-1 (to 430-m) shown in FIG. 8.

Figure 8:
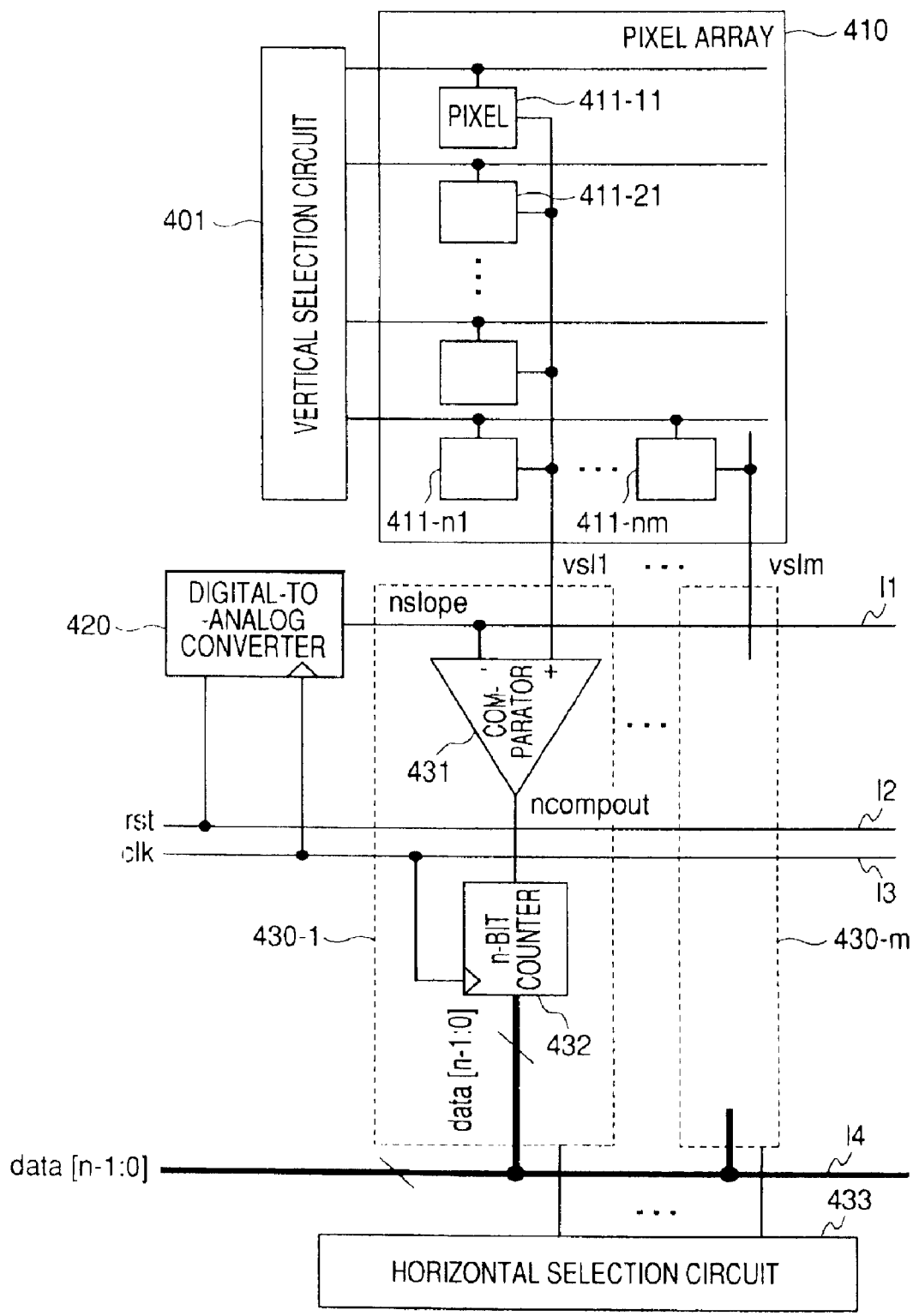
FIG. 8 is a diagram illustrating the block structure of a known solid-state imaging device.
Figure 9:
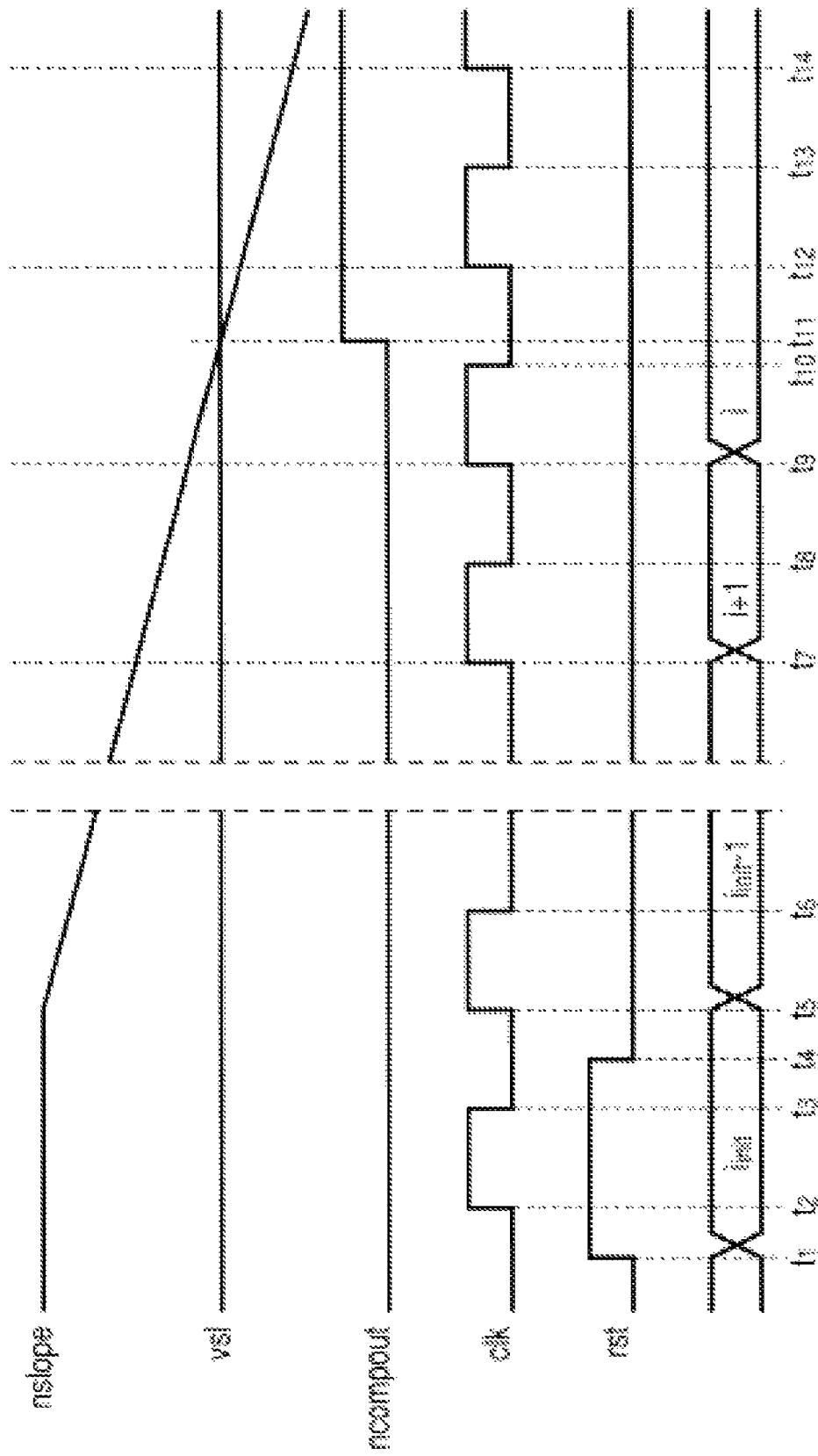
FIG. 9 is a timing chart illustrating the operation of the analog-to-digital converter to be used for the solid-state imaging device shown in FIG. 8.
Figure 10:
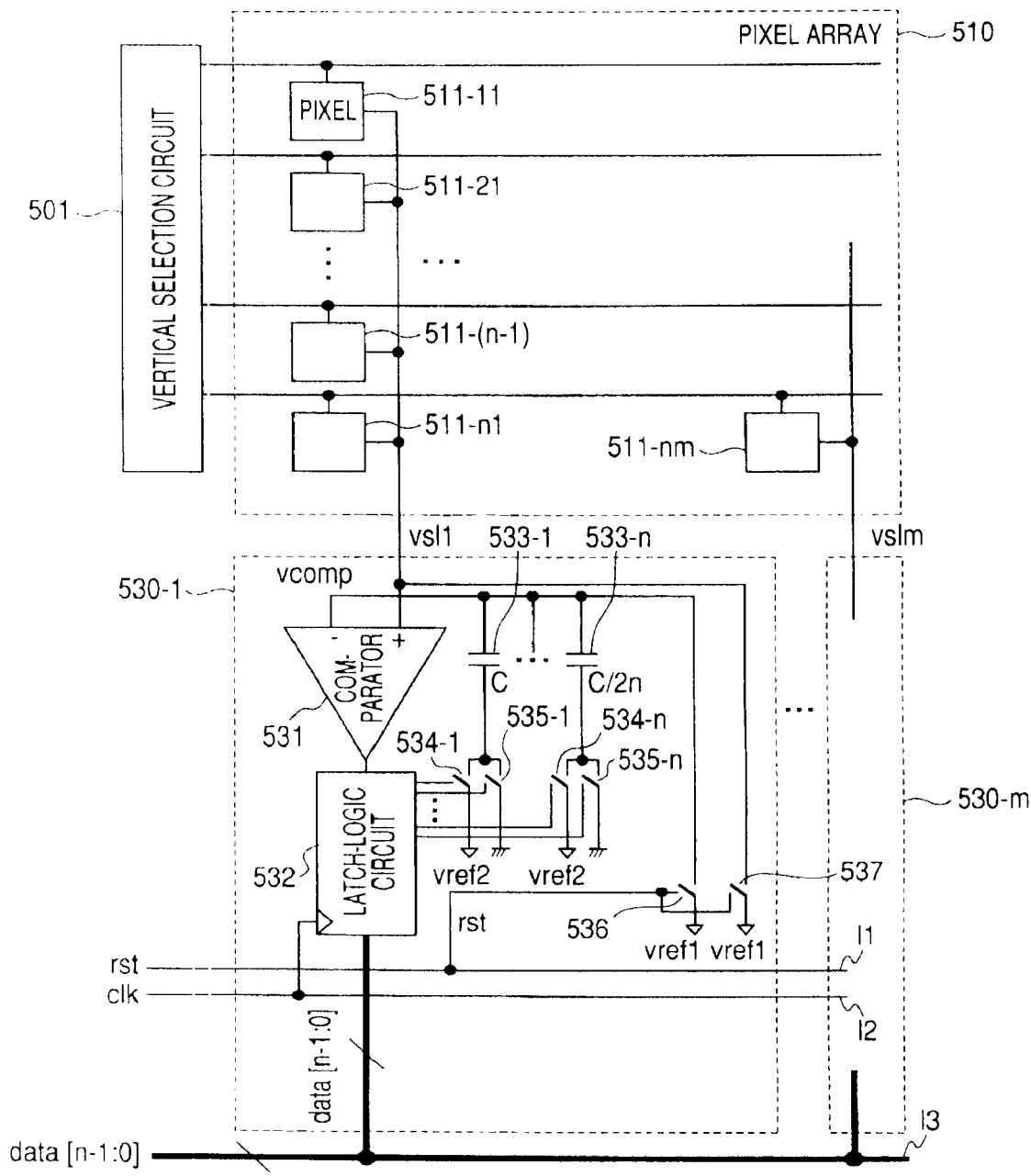
FIG. 10 is a diagram illustrating the block structure of another known solid-state imaging device.
Figure 11:
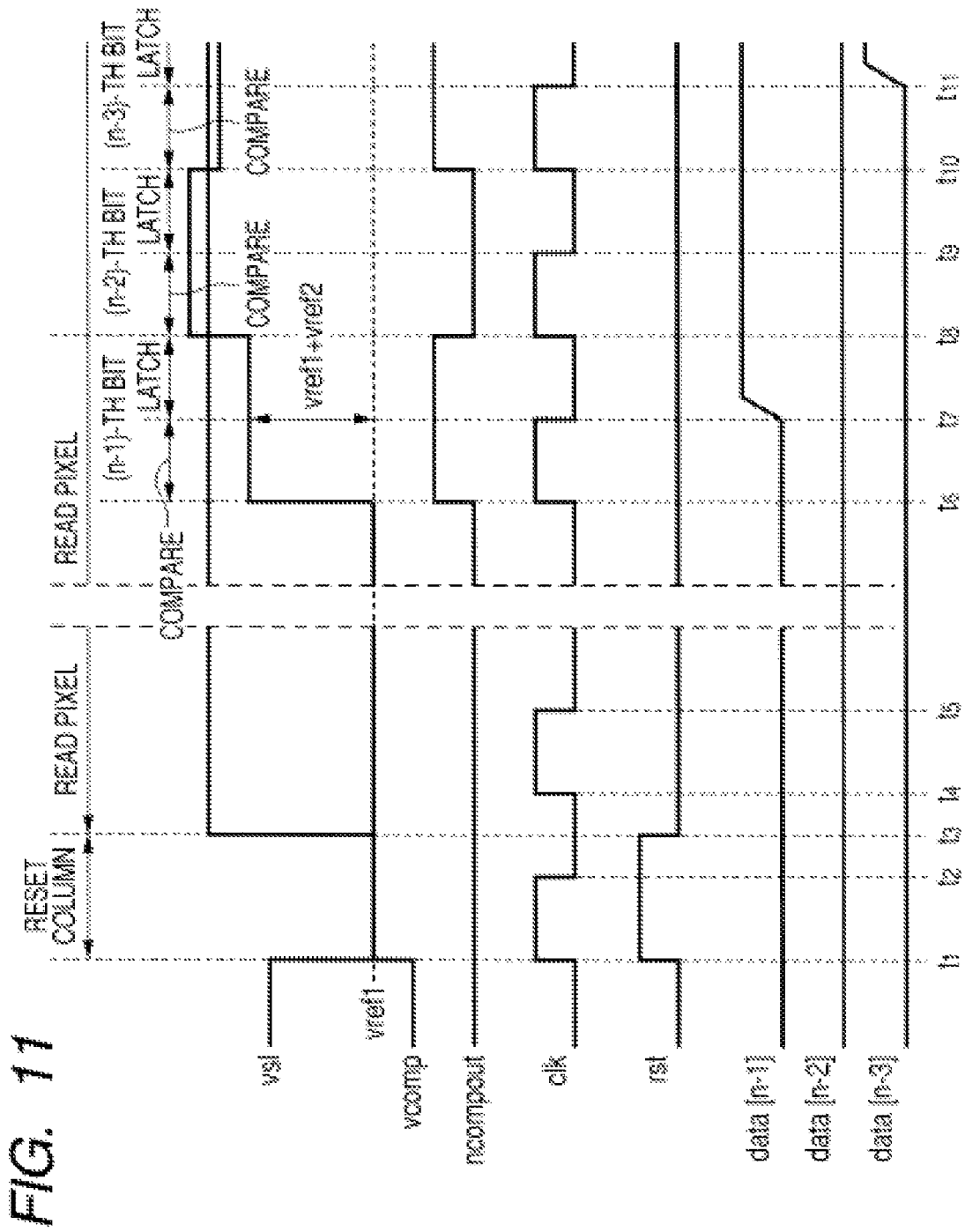
FIG. 11 is a timing chart illustrating the operation of the analog-to-digital converter to be used for the solid-state imaging device shown in FIG. 10.

For example, when it is assumed that n is 12 and m is 8, the necessary cycle becomes $2^{12}-1=4095$ in FIG. 8. Meanwhile, in FIG. 5, the analog-to-digital conversion may be performed with a cycle of $2^8-1+2^{12-8}-1=270$.

Further, $2^n-1$ order of time accuracy or the element accuracy is necessary for the n-bit analog-to-digital conversion. However, it is possible to moderate the accuracy to approximately $2^m$ order in the case of the uppermost m bits and to approximately $2^{n-m}$ order in the case of the lowermost (n–m) bits by separately performing the uppermost m-bit analog-to-digital conversion from the lowermost (n–m)-bit analog-to-digital conversion.

Further, when it is assumed that the current of the constant current source 211 is 'i', the analog signal (voltage) capout to be supplied to the lowermost analog-to-digital converter may be calculated as follows:

$$capout=(i/C1)*t_c$$

(where, '*' indicates a multiplication symbol).

If the values of the current i and the capacitor C1 are appropriately selected, the voltage capout is amplified with respect to the period $t_c$. Therefore, it is possible to moderate the element accuracy and improve the conversion accuracy when performing the lowermost (n–m)-bit analog-to-digital conversion. Further, there is an advantage that a chip area can be small by separating the uppermost m bits from the lowermost (n–m) bits, thereby reducing the number of elements used in the analog-to-digital converter.

Figure 5:
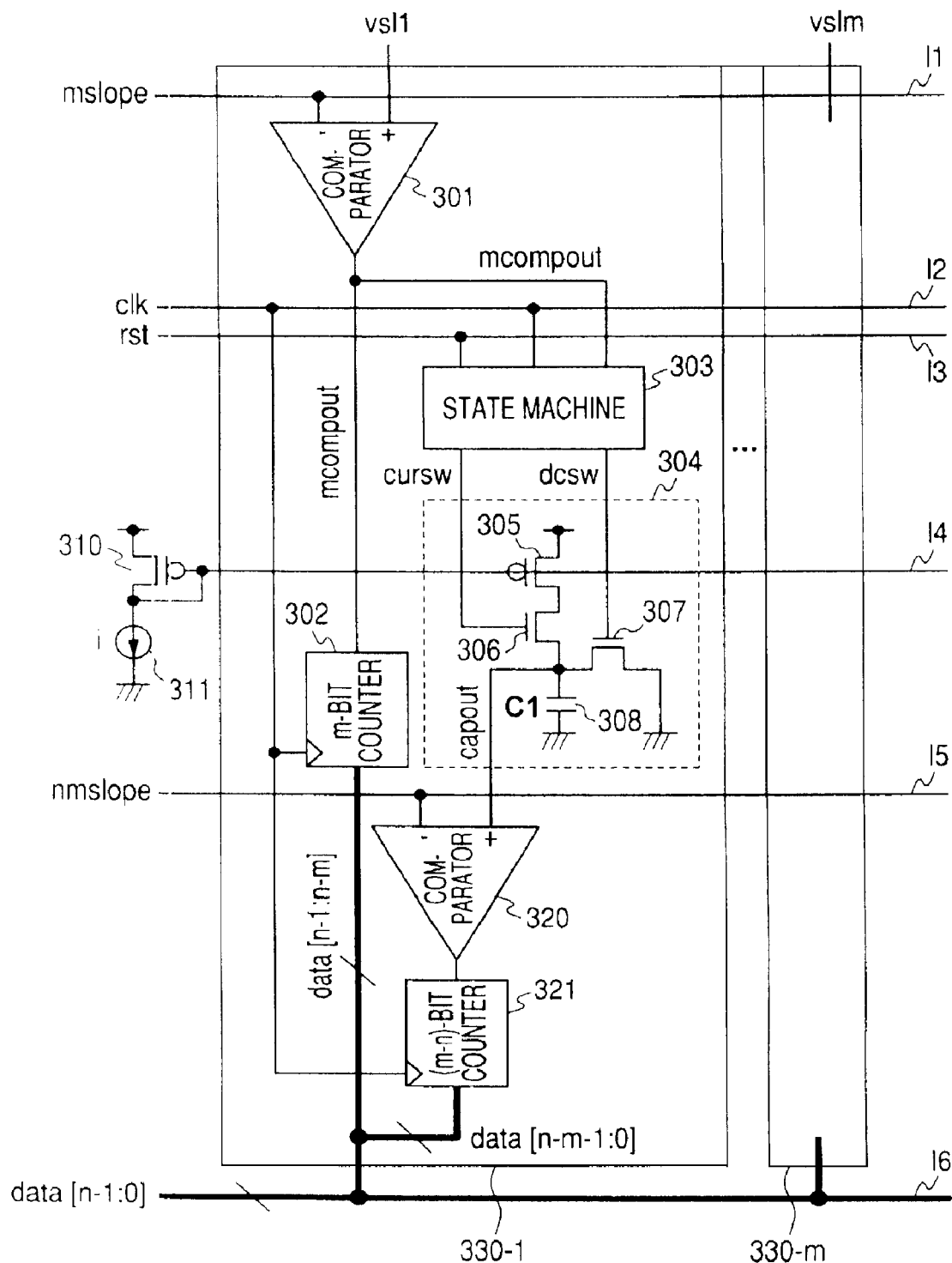
FIG. 5 is a diagram illustrating the block structure of another analog-to-digital converter.

Next, FIG. 5 shows another solid-state imaging device 300 which uses an analog-to-digital converter 330-1 (to 330-m) according to another embodiment of the invention.

In the analog-to-digital converter 330-1 (to 330-m) according to this embodiment of the invention, the structure of a lowermost (n–m) bits of the analog-to-digital converter 220-1 (to 220-m) shown in FIG. 2 has the same structure as the uppermost m-bit counter-ramp-type analog-to-digital converter.

The solid-state imaging device 300 shown in FIG. 5 includes a plurality of analog-to-digital converters 330-1 to 330-m connected to each of the vertical signal lines, respectively. As the same as FIG. 2, in the structure of the analog-to-digital converter 330-1 (to 330-m) shown in FIG. 5, the uppermost m-bit analog-to-digital converter includes a comparator 301 which has an inversion input terminal connected to a line 11 to which the reference signal mslope is input, a non-inversion input terminal connected to the vertical signal line vsl1 (to vslm), and an output terminal connected to an input terminal of an m-bit counter 302. A clock clk is supplied to the m-bit counter 302 so as to perform a counting operation or a reset operation. An output terminal of the m-bit counter 302 is connected to a data[n–1:0] line 16 so as to output digital data of uppermost (n–1) to (n–m) bits.

In the lowermost (n–m)-bit analog-to-digital converter, an input terminal of the state machine 303 is connected to a line 12 of the clock clk, a line 13 of the reset signal rst, and the output terminal of the comparator 301, respectively.

The state machine 303 has a current switch cursw connected to a gate of an N-channel FET 306 and a direct current switch dcsw connected to a gate of an N-channel FET 307.

A P-channel FET 305 has a source connected to a reference potential (power supply), a gate connected to a line 14 and a gate and a drain of a P-channel FET 310, and a drain connected to the drain of the N-channel FET 306.

The P-channel FET 310 has a source connected to a reference potential (power supply), and a gate and a drain connected to one terminal of a constant current source 311. The other terminal of the constant current source 311 is connected to the ground.

The source of the N-channel FET 306 is connected to one terminal of a capacitor C1 (308) and to the drain of the N-channel FET 307. The source of the N-channel FET 307 is connected to the ground. A capacitor C1 has one terminal capout connected to a non-inversion input terminal of a comparator 320 and the other terminal connected to the ground.

The comparator 320 has an inversion input terminal connected to a line 15 (nmslope) and an output terminal connected to an input terminal of a (n–m)-bit counter 321. Further, a clock clk is supplied to the (n–m)-bit counter 321 such that an output terminal of the (n–m)-bit counter 321 is connected to a data[n–1:0] line 15 so as to output lowermost data data[n–m-1:0].

Figure 6:
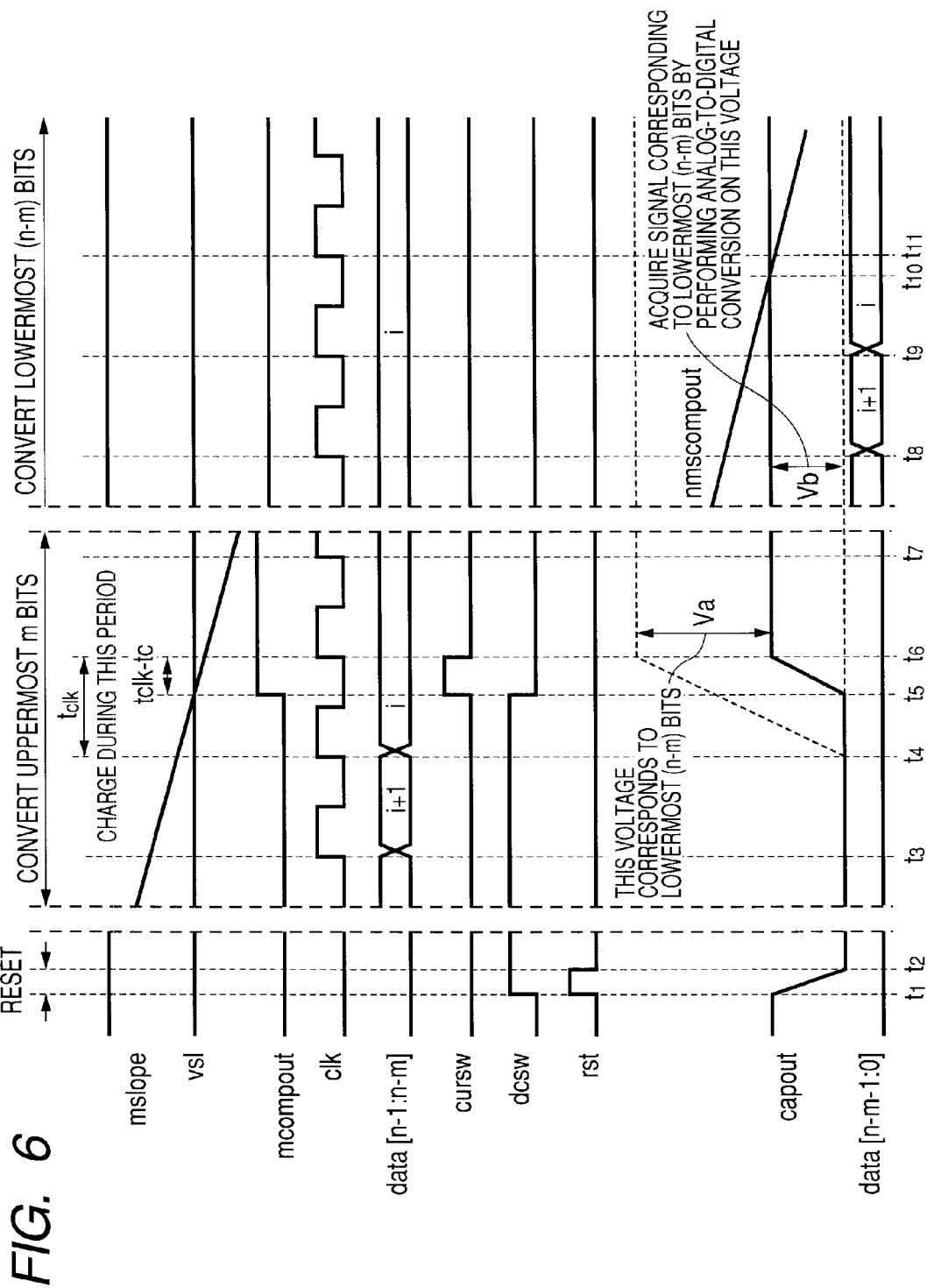
FIG. 6 is a timing chart illustrating the operation of the analog-to-digital converter shown in FIG. 5.

Next, the operation of the analog-to-digital converter 330-1 (to 330-m) will be described with reference to a timing chart of FIG. 6.

A pixel output signal is input to an n-bit analog-to-digital converter provided in column-parallel through the vertical signal line vsl1 (to vslm). The n-bit analog-to-digital converter is divided into an uppermost m-bit analog-to-digital converter and a lowermost (n–m)-bit analog-to-digital converter. The uppermost m-bit analog-to-digital conversion is performed by the comparator 301 and the m-bit counter 302 which are provided in column-parallel. A pixel output signal is input to one input terminal of the comparator 301 and a reference signal mslope output from a digital-to-analog converter is input to another input terminal. The reference signal changes in accordance with an input of the clock from a predetermined initial value. At this time, if the magnitude relationship between the pixel output signal and the reference signal input to the comparator 301 is reversed, an output signal of the comparator 301 changes. Therefore, the m-bit counter 302 counts the number of clocks in accordance with the pixel output signal and a digital data value is obtained according to the number of clocks. Accordingly, uppermost m-bit data data[n–1:n–m] of the pixel output signal is acquired.

Next, the operation of the lowermost (n–m)-bit analog-to-digital conversion will be described.

If the comparator 301 for the uppermost m-bit analog-to-digital conversion determines that a level of the input reference signal mslope is lower than a level of the pixel signal output from the vertical signal line vsl1 (to vslm), a pulse is output from the output terminal of the comparator 301 so as to be supplied to the state machine 303.

A level of a signal output from a current switch cursw of the state machine 303 becomes a high level at time t5 and the signal output from the current switch cursw is supplied to the gate of the N-channel FET 306 such that the N-channel FET is turned on. Thereafter, the current starts to be flown to the capacitor C1(308) and the capacitor C1 (308) is charged with the current until time t6 where the next clock rises.

Since the capacitor C1 (308) should be reset beforehand, the state machine is provided for every row so as to control to reset or charge the capacitor. The operation of the state machine is the same as those described in FIGS. 3A to 3C and a detailed description thereof will be omitted.

One clock clk corresponds to the full scale (Va+Vb) of the lowermost (n−m) bits and a true value of the lowermost (n−m) bits becomes a voltage Va corresponding to a period from time t4 to time t5.

However, the voltage Vb corresponding to a period from time t5 where the output of the comparator 301 becomes a high level to time t6 where a next clock rises may be really measured. Therefore, the true digital value Va may be acquired by digital converting an amount of charge charged in the capacitor C1 (308), that is, the voltage Vb and subtracting the digital-converted value from the digial value (Va+Vb).

The voltage capout charged in the capacitor C1 (308) is supplied to the non-inversion input terminal of the comparator 320. Meanwhile, a signal nmslope is input to the non-inversion input terminal of the comparator 320 through the line 15 and the (n−m)-bit counter 321 starts to perform the counting operation in synchronization with the clock clk at a predetermined timing.

If the level of the voltage capout output from the capacitor C1 (308) is higher than the level of the voltage nmslope, the comparator 320 outputs a pulse at a high level from the output terminal so as to be supplied to the (n−m)-bit counter 321. And then, the (n−m)-bit counter 321 completes the counting operation. The counted value corresponds to voltage Vb shown in FIG. 6. The true (n−m)-bit digital data data [n−m−1:0] corresponding to the voltage Va is acquired by subtracting the digital value of the voltage Vb from the digital value corresponding to the full scale.

Thereafter, the lowermost (n−m)-bit digital data data [n−m-1:0] is sent to digital data data [n−1:0] so as to be composed with the uppermost m-bit data, thereby deriving analog-digital converted data of total n-bit accuracy.

As described above, the operation for the uppermost m-bit analog-digital conversion and the operation until sampling the pixel output signal corresponding to the lowermost (n−m)-bit are basically the same as FIGS. 1 and 3.

The analog-to-digital conversion on the pixel output signal corresponding to the sampled lowermost (n−m) bits is performed by the counter-ramp-type column-parallel analog-to-digital converter as is the case of the uppermost m bits. At this time, a comparator is provided for each column in addition to the counter-ramp-type column-parallel analog-to-digital converter for the uppermost m bits. The signal nmslope output by performing the digital-to-analog conversion is input to the comparator such that the voltage capout of the capacitor is analog-to-digital converted. Therefore, as described above, it is possible to considerably reduce the conversion time and moderate the element accuracy.

Further, the n-bit analog-to-digital converter may not be provided for every column. For example, one analog-to-digital converter may be provided for every two or three columns so as to output digital signals for two or three pixels by performing switching at a predetermined timing.

Next, an analog-to-digital converter according to another embodiment of the invention will be described with reference to FIG. 7.

Figure 7:
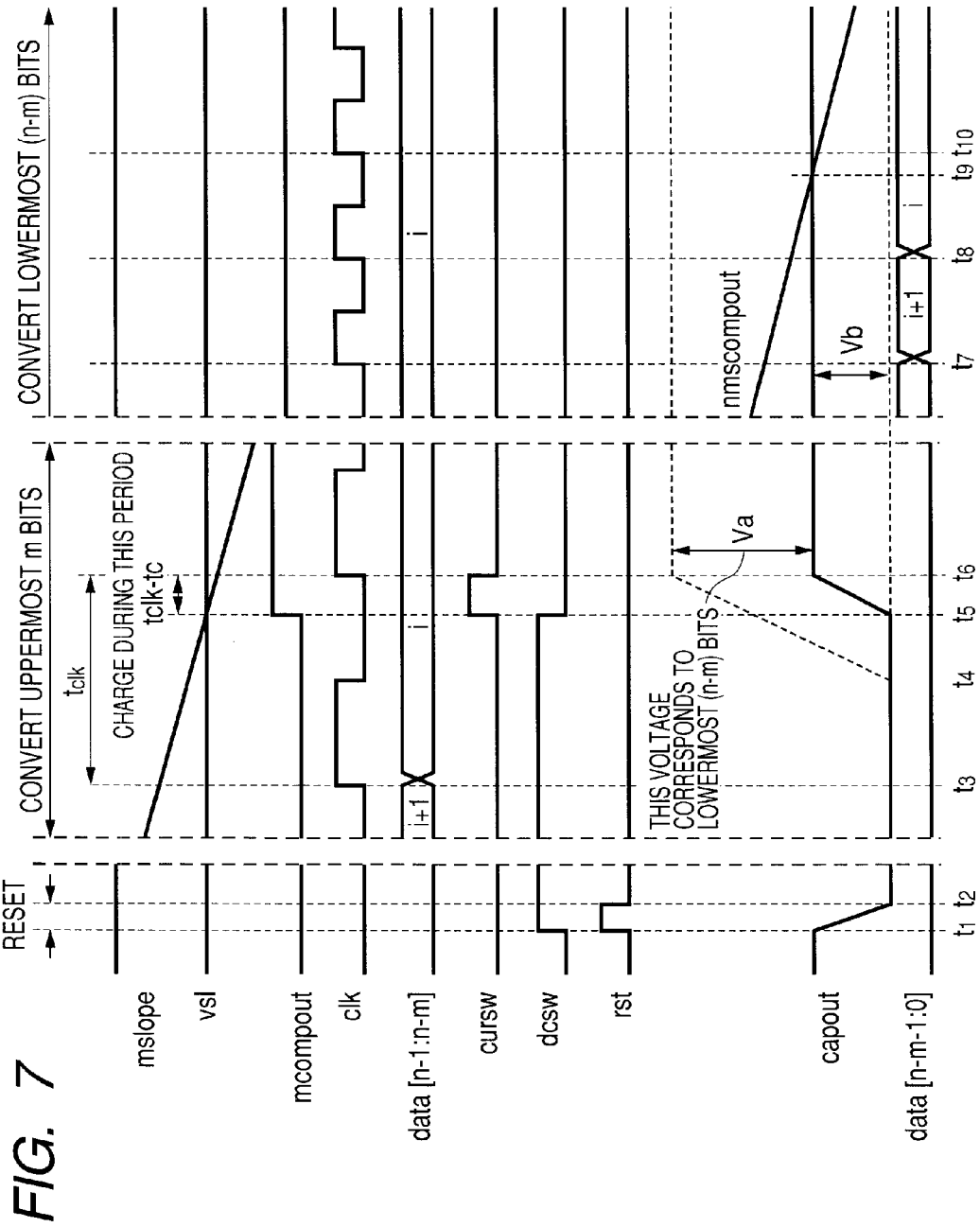
FIG. 7 is a timing chart illustrating the operation of another analog-to-digital converter.

The analog-to-digital converter shown in FIG. 7 is different from the analog-to-digital converter 330-1 (330-$m$) shown in FIG. 5 that a cycle of a clock clk to be supplied to an uppermost m-bit analog-to-digital converter is different from a cycle of a clock clk to be supplied to a lowermost (n−m)-bit analog-to-digital converter. The cycle of the clock clk to be supplied to the uppermost m-bit analog-to-digital converter is set, for example, to be longer than that of the lowermost (n−m)-bit analog-to-digital converter.

On the basis of the conversion time of the uppermost m bits, the comparator compares the reference signal mslope with a pixel output signal output from the vertical signal line vsl1 (to vslm). The magnitudes of the signals are inverted at time t5 and the comparator outputs a pulse mcompout from the output terminal.

The level of a signal output from a current switch cursw of the state machine becomes a high level from a low level at time t5 where the pulse mcompout changes to a high level and the level of a signal output from a current switch cursw is kept at the high level until time t6 where the next clock rises. Thereafter, a predetermined amount of current is charged in the capacitor and an analog voltage to be input to the lowermost (n−m)-bit analog-to-digital converter is sampled.

The operation for the lowermost (n−m)-bit analog-to-digital conversion is the same as that shown in FIG. 5. Therefore, the description thereof will be omitted.

As described above, it is possible to set a period from a point of time where a level of the pulse mcompout crosses a level of the vertical signal line vsl1 (to vslm) to a next clock (at time t6) to be long by setting the cycle $t_{clk}$ of one clock clk corresponding to the full scale of the lowermost n−m bits to be longer than the cycle of an operation clock of the lowermost analog-to-digital converter.

As a result, the cycle $t_{clk}$-$t_c$ which is necessary to charge current to the capacitor may be longer and the voltage to be charged to the capacitor may be larger than as compared with FIG. 5. Therefore, it is possible to perform the digital conversion operation for the lowermost (n−m) bits with high accuracy.

As described above, in the column-parallel analog-to-digital conversion of the solid-state imaging device, the uppermost m-bit analog-to-digital converter is separated from the lowermost (n−m)-bit analog-to-digital conversion. Therefore, it is possible to reduce the conversion time by approximately $2^m$ order in the uppermost m bits and by approximately $2^{n-m}$ order in the lowermost (n−m) bits and to moderate the element accuracy.

Further, in the column-parallel analog-to-digital conversion of the solid-state imaging device, it is possible to reduce the conversion time by charging the capacitor with the voltage corresponding to the lowermost (n−m) bits for the counter-ramp-type analog-to-digital conversion in which smaller area is necessary than the successive approximation type analog-to-digital conversion but the longer conversion time is necessary than the successive approximation type analog-to-digital conversion for the sampling and performing analog-to-digital conversion for the additionally provided lowermost (n−m) bits. Further, it is possible to moderate the element accuracy.

In the column-parallel analog-to-digital conversion of the solid-state imaging device, although the analog-to-digital conversion is performed by using the counter-ramp-type analog-to-digital conversion in which smaller area is necessary than the successive approximation type analog-to-digital conversion but the longer conversion time is necessary than the successive approximation type analog-to-digital conversion, it is possible to implement the solid-state imaging device capable of reducing the conversion time.

For example, in the case of an analog-to-digital conversion for performing monitoring when an image is captured, the analog-to-digital conversion is performed on only the uppermost m bits. Further, when high accuracy is necessary in a case of capturing a real image, the analog-to-digital conversion is performed on the lowermost (n–m) bits in addition to the analog-to-digital conversion on the uppermost m bits. Therefore, it is possible to implement a high speed monitor and implement a solid-state imaging device which uses low power consumption.

The analog-to-digital conversion is performed on the lowermost (n–m) bits with respect to only signals under a predetermined level using the pixel output signal acquired by performing the uppermost m-bit analog-to-digital conversion. Therefore, a high-accuracy analog-to-digital conversion is performed with respect to the pixel output signal of low illumination, which has low photo-shot-noises. Further, a low-accuracy analog-to-digital conversion is performed on the pixel output signal of high illumination, which has high photo-shot-noise. Accordingly, it is possible to implement a solid-state imaging device which uses lower power consumption.

Figure 12:
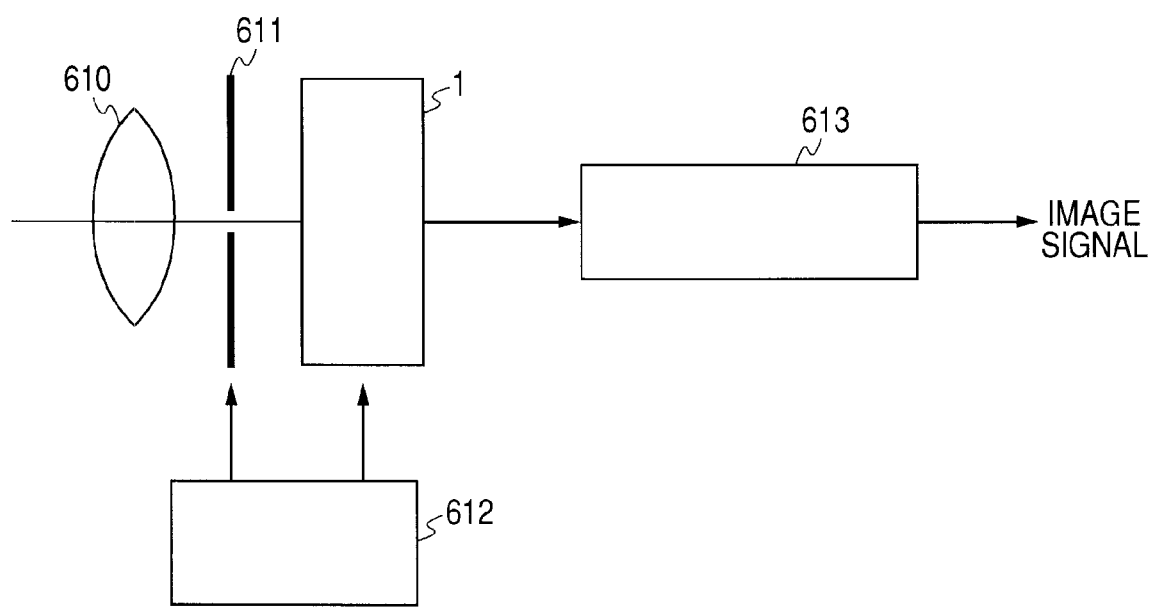
FIG. 12 is a cross-sectional view of a camera according to an embodiment of the invention.

FIG. 12 is a cross-sectional view of a camera according to another embodiment of the invention. The camera according to the embodiment of the invention is an example of a video camera capable of capturing a video.

The camera according to the embodiment of the invention includes a solid-state imaging device 1 related to the solid-state imaging devices 100, 200, 300, 400, and 500, an optical system 610, a shutter device 611, a driving circuit 612, and a signal processing circuit 613.

The optical system 610 focuses image light (incident light) from an object on an imaging area of the solid-state imaging device 1 so as to form an image. Therefore, electrical charge of a corresponding signal is stored in the solid-state imaging device 1 during a predetermined period.

The shutter device 611 controls a light irradiation period and a light shielding period with respect to the solid-state imaging device 1.

The driving circuit 612 supplies a driving signal so as to control a transmission operation of the solid-state imaging device 1 and a shutter operation of the shutter device 611. The electrical charge of the solid-state imaging device 1 is transmitted on the basis of the driving signal (timing signal) supplied from the driving circuit 612. The signal processing circuit 613 performs various signal processes. The processed image signals are stored in a storage medium such as a memory or output to a monitor.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a plurality of pixels which are arranged in a matrix of rows and columns;
   a sequential scanning device that selects each row of pixels;
   a first analog-to-digital converter that (a) receives a pixel signal from the plurality of pixels by means of a vertical signal line and (b) performs a first analog-to-digital conversion on an upper bit portion of the pixel signal;
   a digital-to-analog converter connected to the output of the first analog to digital converter and that receives the converted upper bit-length portion of the pixel signal from the first analog to digital converter;
   a subtraction processing unit connected to output of the digital-to-analog converter and the vertical signal line and which outputs the difference between the upper bit length portion of the pixel signal and the pixel signal from the vertical signal line;
   a second analog-to-digital converter connected to the output of the subtraction processing unit and that performs a second analog-to-digital conversion on the output from the subtraction processing unit,
   wherein,
   a current output unit supplies an analog signal representing the lowermost n-m bits to a capacitor using a part of operation clock cycles of the first analog-to-digital converter,
   the current output unit changes an amount of current to be supplied to the capacitor so as to change a level of the analog signals on the lowermost (n-m) bits,
   in a monitoring mode, only the first analog to digital conversion is performed, and
   in an imaging mode, both the first analog-to-digital conversion and the second analog-to-digital conversion are performed.

2. The solid-state imaging device according to claim 1, wherein the analog-to-digital converter unit includes a third analog-to-digital converter that (a) is connected to a rear stage of the second analog-to-digital converter, (b) subtracts an analog signal corresponding to the second bit-length from the analog signal to be input to the second bit-length analog-to-digital converter when the second analog-to-digital converter completes the conversion operation, and (c) performs a third bit-length analog-to-digital conversion.

3. The solid-state imaging device according to claim 1, wherein the first analog-to-digital converter performs the analog-to-digital conversion on the uppermost m bits, and the second analog-to-digital converter performs the analog-to-digital conversion on lowermost n-m bits, (n and m are positive integral numbers and n is larger than m so as to perform n-bit analog-to-digital conversion.

4. The solid-state imaging device according to claim 1, wherein the first analog-to-digital converter is a counter-ramp-type analog-to-digital converter.

5. The solid-state imaging device according to claim 4, wherein the operation clock cycle of the first analog-to-digital converter is longer than an operation clock cycle of the second analog-to-digital converter.

6. A solid-state imaging device comprising:
   a plurality of pixels arranged in a matrix of rows and columns;
   a sequential scanning device that selects each row of pixels;
   a plurality of uppermost m-bit analog-to-digital converters arranged in column-parallel form which respectively convert an analog signal from at least one pixel in each column into n-bit digital signals, (where n is an arbitrary positive integral number;
   a plurality of digital-to-analog converters arranged in column-parallel and respectively connected to the outputs of the uppermost n-bit analog-to-digital converters and which convert the n-bit digital signals to analog signals and which output reference signals corresponding to a length of an uppermost m bits;
   a plurality of subtraction processing units respectively connected to the outputs of the digital-to-analog converters and to the analog signals from the pixels and that subtract the reference signals from the analog signals; and a plurality of lowermost (n-m)-bit analog-to-digital converters respectively connected to the outputs of the subtraction processing units, wherein, in an imaging mode, when analog-to-digital conversion is performed on an output signal from the pixels or a pixel output signal obtained by sampling the output signal, (i) the analog-to-digital conversion is initially performed on the uppermost m bits, (ii) the digital-to-analog conversion is then performed on the uppermost m bits to output the reference signal, (iii) a signal corresponding to the reference signal is subtracted from the pixel output signal, and (iv) the analog-to-digital conversion is performed on the lowermost n-m bits, the current output unit supplies an analog signal representing the lowermost n-m bits to a capacitor using a part of operation clock cycles of the uppermost m-bit analog-to-digital converter, in a monitoring mode, when analog-to-digital conversion is performed on an output signal from the pixels or a pixel output signal obtained by sampling the output signal, the analog-to-digital conversion is performed on the uppermost m bits only, and the current output unit changes an amount of current to be supplied to the capacitor so as to change a level of a lowermost (n-m)-bit input analog signal.

7. The solid-state imaging device according to claim 6, wherein the uppermost m-bit analog-to-digital converter is a counter-ramp-type analog-to-digital converter.

8. The solid-state imaging device according to claim 6, wherein an operation clock cycle of the uppermost m-bit analog-to-digital converter is longer than an operation clock cycle of the lowermost (n-m)-bit analog-to-digital converter.

9. A solid-state imaging device comprising:

a plurality of pixels which are arranged in a matrix of rows and columns;

a sequential scanning device that selects each row of pixels; and a plurality of uppermost m-bit analog-to-digital converters which convert respective analog signals from the pixels in the selected row into respective n-bit digital signals, (where n is an arbitrary positive integral number;

a like plurality of digital-to-analog converters arranged in column-parallel form and connected to the outputs of respective uppermost m-bit analog to digital converters;

a like plurality of subtraction processing units connected to the outputs of respective digital-to-analog converters and that subtract output signal outputs of the digital-to-analog converters from the analog signals from the pixels;

a like plurality of lowermost (n-m)-bit analog-to-digital converters connected to the outputs of the respective subtraction processing units, wherein, an uppermost m-bit analog-to-digital conversion is performed by a comparator and a clock counter which are arranged in column-parallel form, the comparator having one input terminal to which a pixel output signal is input and another input terminal to which a reference signal output is input, the reference signal starts from a predetermined initial value and is changed in accordance with a clock input, when a magnitude relationship between the pixel output signal and the reference signal input to the comparator is reversed, an output signal from the comparator changes so as to count the number of clocks according to the pixel output signal and acquire an uppermost m-bit analog-to-digital conversion value of the pixel output signal by acquiring a digital value according the number of clocks, an analog signal representing the lowermost (n-m)-bit is stored in a capacitor in a period from a time when the output signal of the comparator changes to a time when the next cycle of the clock starts each of the lowermost (n-m)-bit analog-to-digital converters performs an the uppermost m-bit analog-to-digital conversion is performed, the current output unit changes an amount of current to be supplied to the capacitor so as to change a level of the analog signals on the lowermost (n-m) bits, in a monitoring mode, only the uppermost m-bit analog-to-digital conversion is performed, and in an imaging mode, the uppermost m-bit analog-to-digital conversion and the lowermost (n-m)-bit analog-to-digital conversion are both performed.

10. The solid-state imaging device according to claim 9, wherein, the lowermost (n-m)-bit pixel output signal stored in the capacitor is input to one input terminal of the comparator, a reference signal is input to another input terminal of the comparator, the reference signal starts a predetermined initial value and is changed in accordance with a clock input from, and when a magnitude relationship between the lowermost (n-m)-bit pixel output signal and the reference signal which are input to the comparator is reversed, an output signal of the comparator changes so as to count the number of clocks according to the lowermost (n-m)-bit pixel output signal and the analog-to-digital conversion is performed on the lowermost (n-m)-bit pixel output signal by acquiring a digital value according the number of clocks.

11. The solid-state imaging device according to claim 9, wherein an operation clock cycle of the uppermost m-bit analog-to-digital converter is longer than an operation clock cycle of the lowermost (n-m)-bit analog-to-digital converter.

12. A method of driving a solid-state imaging device which includes a plurality of pixels which are arranged in a matrix of rows and columns, a sequential scanning device that selects each row of pixels, and an analog-to-digital conversion unit having (i) a first analog-to-digital converter that is connected to a vertical signal line to which a pixel signal is supplied from the pixels, (ii) a digital-to-analog converter connected to the first analog-to-digital converter and which outputs a reference signal, (iii) a subtraction processing unit connected to an output of the first digital-to-analog converter and that subtracts an analog signal corresponding to the reference signal from the pixel signal, (iv) a second analog-to-digital converter connected to the output of the subtraction processing unit, the method comprising the steps of:

performing a first bit-length analog-to-digital conversion on an output signal from the vertical signal line or a pixel output signal obtained by sampling the output signal by the first analog-to-digital converter;

after the first analog-to-digital conversion is completed, performing a digital-to-analog conversion on the first bit-length to output the reference signal; and subtracting an analog signal corresponding to the reference signal from the pixel signal and then performing a second bit-length analog-to-digital conversion by the second analog-to-digital converter performing a second analog-to-digital conversion by the result of the subtraction step, wherein, a current output unit supplies an analog signal representing the lowermost n-m bits to a capacitor using a part of operation clock cycles of the first analog-to-digital converter, in a monitoring mode, only the first analog-to-digital conversion is performed, in an imaging mode, both the first analog-to-digital conversion and the second analog-to-digital conversion are performed, and the current output unit changes an amount of current to be supplied to the capacitor so as to change a level of the analog signals on the lowermost n-m bits.

13. A camera comprising:

a plurality of pixels which are arranged in a matrix of rows and columns;

a sequential scanning device that selects each row of pixels;

a first analog-to-digital converter connected to a vertical signal line to which a pixel signal is supplied from a pixel in a column and performs a first bit-length analog-to-digital conversion on the pixel signal from the vertical signal line or a pixel output signal obtained by sampling the pixel signal;

a digital-to-analog converter that, after the first analog-to-digital converter completes the conversion operation, performs a digital-to-analog conversion to output a reference signal corresponding to the first bit-length of an output from the first analog-to-digital converter;

a subtraction processing unit connected to the output of the first digital-to-analog converter and that subtracts an analog signal corresponding to the reference signal from the pixel signal; and a second analog-to-digital converter connected to the output of the subtraction processing unit that receives the result of the subtraction processing unit and performs a second bit-length analog-to-digital conversion on the result, wherein, a current output unit supplies an analog signal representing the lowermost n-m bits to a capacitor using a part of operation clock cycles of the first analog-to-digital converter, in a monitoring mode, only the first analog to digital conversion is performed, and in an imaging mode, both the first analog-to-digital conversion and the second analog-to-digital conversion are performed, and the current output unit changes an amount of current to be supplied to the capacitor so as to change a level of the analog signals on the lowermost n-m bits.

* * * * *